(12) United States Patent
Doong et al.

(10) Patent No.: US 7,388,263 B2
(45) Date of Patent: Jun. 17, 2008

(54) SHALLOW TRENCH ISOLATION DUMMY PATTERN AND LAYOUT METHOD USING THE SAME

(75) Inventors: Kelvin Yih-Yuh Doong, Kaohsiung (TW); Chin-Chiu Hsia, Taipei (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 81 days.

(21) Appl. No.: 10/993,937

(22) Filed: Nov. 19, 2004

(65) Prior Publication Data

US 2005/0112840 A1    May 26, 2005

(30) Foreign Application Priority Data

Nov. 21, 2003    (TW) .............. 92132806 A

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ...................... 257/401; 257/510

(58) Field of Classification Search ............... 257/374, 257/506, 510, 401
See application file for complete search history.

(56) References Cited

U.S. PATENT DOCUMENTS

| 5,902,752 | A | 5/1999 | Sun et al. ............. 437/195 |
| 6,010,939 | A | 1/2000 | Bothra ................. 438/386 |
| 6,020,616 | A * | 2/2000 | Bothra et al. .......... 257/381 |
| 6,327,695 | B1 | 12/2001 | Bothra et al. ............. 716/8 |
| 6,335,560 | B1 | 1/2002 | Takeuchi ............... 257/620 |
| 6,693,315 | B2 * | 2/2004 | Kuroda et al. .......... 257/288 |

OTHER PUBLICATIONS

Merriam-Webster Online Dictionary www.m-w.com.*

* cited by examiner

*Primary Examiner*—Monica Lewis
(74) *Attorney, Agent, or Firm*—Thomas, Kayden, Horstemeyer & Risley

(57) ABSTRACT

A dummy cell pattern for shallow trench isolation (STI). Active and shallow trench isolation areas are bounded by a circumference. An active area pattern completely overlaps the active area and a first polysilicon pattern in the shallow trench isolation area is outside the active area pattern. Layout methods using the same are also disclosed.

8 Claims, 15 Drawing Sheets

SHALLOW TRENCH ISOLATION DUMMY PATTERN AND LAYOUT METHOD USING THE SAME

BACKGROUND

The invention relates to the fabrication of integrated circuit devices, and more particularly, to a shallow trench isolation (STI) dummy pattern and layout method using the same.

Continued semiconductor device performance improvements are achieved by miniaturization of device features, resulting in continued reduction of semiconductor device dimensions. Active devices are electrically isolated over the surface of a substrate by areas of field isolation in which STI is a major application. Surface planarity of areas of field isolation is frequently obtained by applying chemical mechanical polishing (CMP) of a deposited layer of field isolation oxide.

Using the STI approach for VLSI technology, deep trenches are typically formed in the substrate by reactive ion etching. The trenches are typically about 5-6 µm deep, about 2-3 µm wide and spaced about 2.5-3.5 µm apart from other trenches. ULSI technology requires trenches that are deeper and spaced closer together, posing new problems in field turn-on, punchthrough and gap-fill within the trenches and others.

STI areas can be formed using, for example, Buried Oxide (BOX) isolation for the shallow trenches. The method involves filling the trenches with a chemical vapor deposition (CVD) of silicon dioxide ($SiO_2$) and then etching, or mechanically or chemically polishing the $SiO_2$ to yield a planar surface.

Following formation of trenches in the surface of a substrate they are filled with a suitable dielectric material such as oxide, polysilicon or an organic polymeric material, for example polyimide. While the dielectric-filled trench isolation can provide effective dielectric isolation between devices, the fundamental disadvantage is that the resulting structure tends to be non-planar, mainly due to the difference in the amount required to fill multiple closely spaced trenches and dielectric deposited on the surface of the substrate. This effect is further aggravated by steps of baking and curing applied to the deposited dielectric to cure the dielectric and evaporate solvents. Further problems can be caused in this respect by significant difference in device density across the chip. Poor planarity across the surface of the trenches leads to further problems in creating interconnect patterns and in depositing overlying layers of insulation and metallization.

Another problem associated with the formation of STI areas is that if the silicon oxide is etched or polished to the surface of the silicon substrate, dishing occurs in the surface of the silicon oxide, resulting in a concave surface of the STI areas, resulting recesses in the field oxide at the edge of the device areas. When gate electrodes are formed for CMOS devices, the gate electrodes extend over the device area edge, causing undesirable lower and variable threshold voltage when the devices are completed. It is therefore desirable to form isolation areas extending higher than the substrate surface to avoid such problems while reducing manufacturing costs.

U.S. Pat. No. 6,327,695 B1 (Bothra et al.) discloses a chip design method including STI and active area (AA) using dummy poly lines to reduce capacitance.

U.S. Pat. No. 6,020,616 (Bothra et al.) reveals a chip design method including STI and AA using dummy poly lines and dummy Active Areas.

U.S. Pat. No. 6,010,939 (Bothra), U.S. Pat. No. 6,335,560 B1 (Takeuchi) and U.S. Pat. No. 5,902,752 (Sun et al.) are related patents using dummy structures.

SUMMARY

Embodiments of the invention provide a dummy cell pattern for shallow trench isolation. The dummy pattern comprises active and shallow trench isolation areas bounded by a circumference, an active area pattern, and a first polysilicon pattern. The active area pattern completely overlaps the active area and the first polysilicon pattern is formed in the shallow trench isolation area without overlapping the active area pattern.

The circumference may be rectangular and have a first pair and a second pair of sides. The active area may be rectangular and have a third pair and a fourth pair of sides corresponding to the first pair and the second pair of sides, respectively.

The first polysilicon pattern is formed between one of the first pair of sides and one of the corresponding third pair of sides. Moreover, the dummy cell pattern further comprises a second polysilicon pattern formed in the shallow trench isolation area without overlapping the active area pattern and between one of the second pair of sides and one of the corresponding fourth pair of sides.

Additionally provided is a layout method for shallow trench isolation. Destined layout objects are extracted. First forbidden areas are defined, which surround the extracted destined layout objects. A first dummy pattern is formed in a first area beyond the destined layout objects and the first forbidden areas. Second forbidden areas are defined comprising the first dummy pattern, the destined layout objects, and the first forbidden areas. A second dummy pattern is formed in a second area beyond the second forbidden areas. Second layout objects are defined by attaching the first dummy pattern and the second dummy pattern to the destined layout objects.

The first dummy pattern comprises a plurality of first dummy cell patterns, each comprising active and shallow trench isolation areas bounded by a circumference, an active area pattern, and a first polysilicon pattern. The active area pattern completely overlaps the active area and the first polysilicon pattern is formed in the shallow trench isolation area without overlapping the active area pattern.

The circumference may be rectangular and have a first pair and a second pair of sides. The active area may be rectangular and have a third pair and a fourth pair of sides corresponding to the first pair and the second pair of sides, respectively.

The first polysilicon pattern is formed between one of the first pair of sides and one of the corresponding third pair of sides. Moreover, the first dummy cell pattern further comprises a second polysilicon pattern formed in the shallow trench isolation area without overlapping the active area pattern and between one of the second pair of sides and one of the corresponding fourth pair of sides.

The second dummy pattern comprises a plurality of second dummy cell patterns, each similar to and smaller than the first dummy cell pattern.

The second dummy cell patterns are misaligned with each other as well as the first dummy cell patterns.

Embodiments of the invention further provide a layout method for shallow trench isolation. Destined layout objects are extracted. First forbidden areas are defined, which surround the extracted destined layout objects. A dummy pattern is formed in a first area beyond the destined layout objects and the first forbidden areas, wherein the dummy pattern comprises a plurality of dummy cell pattern. Each dummy cell pattern comprises active and shallow trench isolation areas bounded by a circumference, an active area pattern, and a first polysilicon pattern. The active area pattern completely overlaps the active area and the first polysilicon pattern is formed in the shallow trench isolation area without overlapping the active area pattern. Second layout objects are created by attaching the dummy pattern to the destined layout objects.

The circumference may be rectangular and have a first pair and a second pair of sides. The active area may be rectangular and have a third pair and a fourth pair of sides corresponding to the first pair and the second pair of sides, respectively.

The first polysilicon pattern is formed between one of the first pair of sides and one of the corresponding third pair of sides. Moreover, the dummy cell pattern further comprises a second polysilicon pattern formed in the shallow trench isolation area without overlapping the active area pattern and between one of the second pair of sides and one of the corresponding fourth pair of sides.

The dummy cell patterns are misaligned with each other.

Embodiments of the invention still further provide a dummy device for shallow trench isolation. The dummy device comprises a substrate having a shallow trench isolation area, at least one dummy active layer, and at least one dummy polysilicon layer. The dummy active layer is within the shallow trench isolation area. The top surface of the dummy active layer is substantially level with that of the shallow trench isolation area. The dummy polysilicon layers are formed only on the shallow trench isolation area without overlapping the underlying dummy active layer.

BRIEF DESCRIPTION OF THE DRAWINGS

Embodiments of the invention will become more fully understood from the detailed description given hereinbelow and the accompanying drawings, given by way of illustration only and thus not intended to be limitative of the invention.

DETAILED DESCRIPTION

In a typical semiconductor device circuit layout, in surface areas of the substrate where pattern density of active devices is less than an average density, the density of deposited and patterned polysilicon, used for creation of active devices, is less than an average polysilicon density. As a result, a dummy pattern is conventionally created which fills surface areas comprising active devices, polysilicon, well boundary and other device features that are created in or over the surface of a substrate. This means that both features of active elements and dummy patterns, typically formed using polysilicon, are present in low-density surface areas of the substrate. It is clear that a dummy pattern is to be added in order to increase the pattern density, a key aspect of this however is to place the dummy pattern such that circuit performance is not negatively affected by the provided dummy pattern.

Embodiments disclosed have address dummy pattern filling for STI, comprising active (or diffusion) and polysilicon layer dummy patterns. A separating placement reduces parasitic capacitance due to metal-active and metal-polysilicon interaction. Dummy filling can be applied to solve pattern density constraints of two layers.

Figure 1:
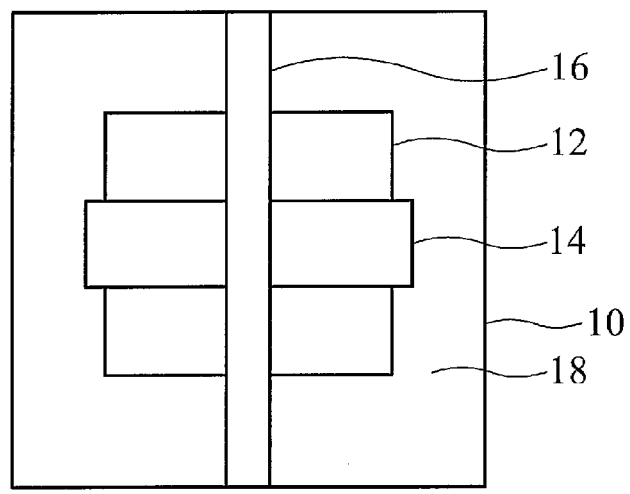
FIGS. 1 and 2 are top views of two exemplary conventional dummy devices for STI.
Figure 2:
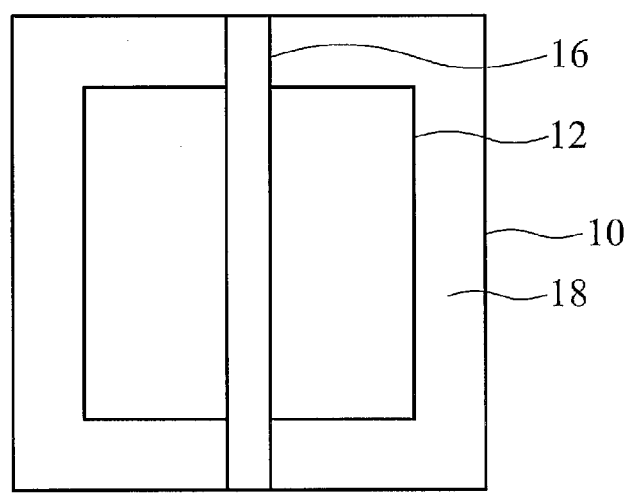

FIGS. 1 and 2 are top views of exemplary conventional dummy devices for STI. As shown in FIG. 1, a boundary area 10 is defined, surrounding a substrate (not shown). A dummy active (or diffusion) area 12 is defined over the substrate. A dummy layer 14, typically of polysilicon, is defined over the boundary area 10 and the active area 12. A first level metal (metal-1) layer 16 overlies a STI area 18, the active area 12, and the dummy polysilicon layer 14. As shown in FIG. 2, however, only a metal-1 layer 16 is provided over the active area 12.

Figure 3:
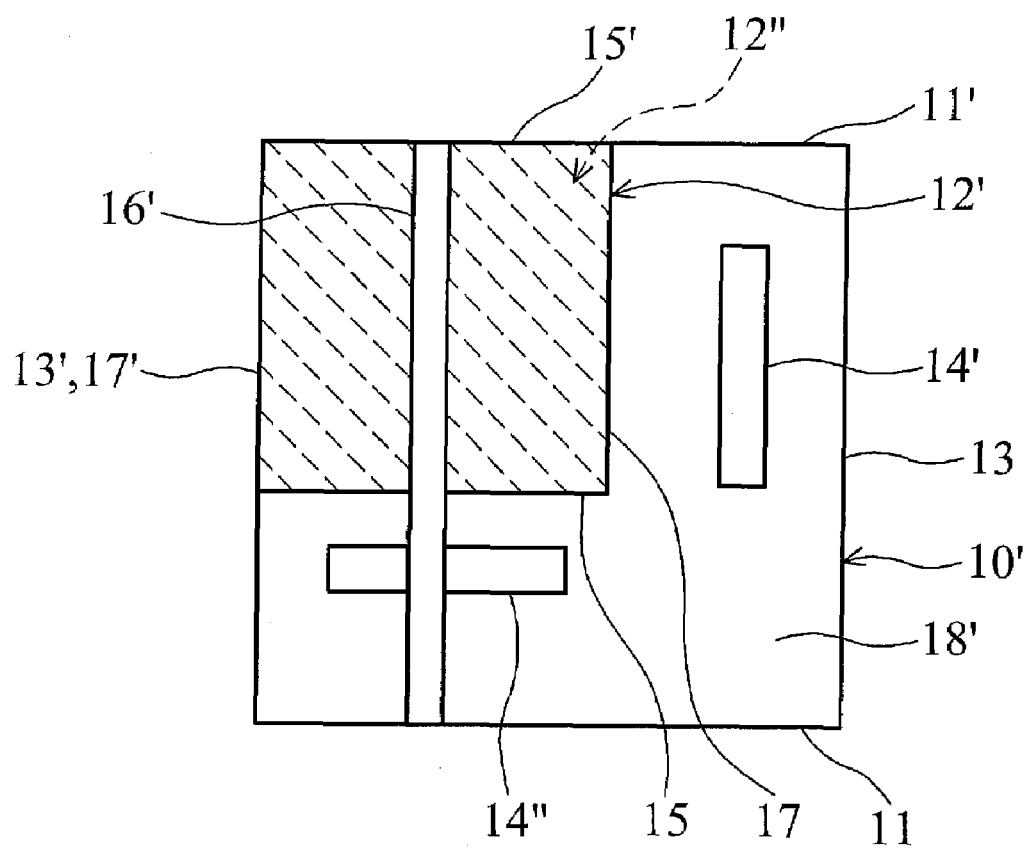
FIG. 3 is a top view of an embodiment of a dummy cell pattern for STI.

FIG. 3 is a top view of an embodiment of a dummy cell pattern for STI. The dummy cell pattern comprises active and shallow trench isolation (or field insulator) areas 12' and 18' bounded by a circumference 10', an active area pattern 12", and polysilicon patterns 14' and 14". The circumference 10' may be rectangular, circular, or polygonal. Preferably, the circumference 10' is rectangular and has a first pair of sides 11 and 11' and a second pair of sides 13 and 13'. The active area pattern 12" is formed over the active area 12' and completely overlaps thereof. The polysilicon patterns 14' and 14" are formed over the STI area 18', not overlapping the active area pattern 12".

Active area 12' may have a profile similar to the circumference 10'. For example, the active area 12' may be rectangular with a third pair of sides 15 and 15' corresponding to the first pair of sides 11 and 11' and a fourth pair of sides 17 and 17' corresponding to the second pair of sides 13 and 13'. Moreover, the side 11' may coincide with the side 15' and the side 13' with the side 17'. Furthermore, the polysilicon patterns 14' and 14" may be rectangular, respectively formed between the sides 13 and 17 and sides 11 and 15.

Chip layout information is conventionally stored and manipulated based on computer aided design (CAD) files and software support systems. The routines that are provided by the embodiments as these routines relate to chip layout and to providing the dummy patterns as they have been described above will next be described.

Figure 4:
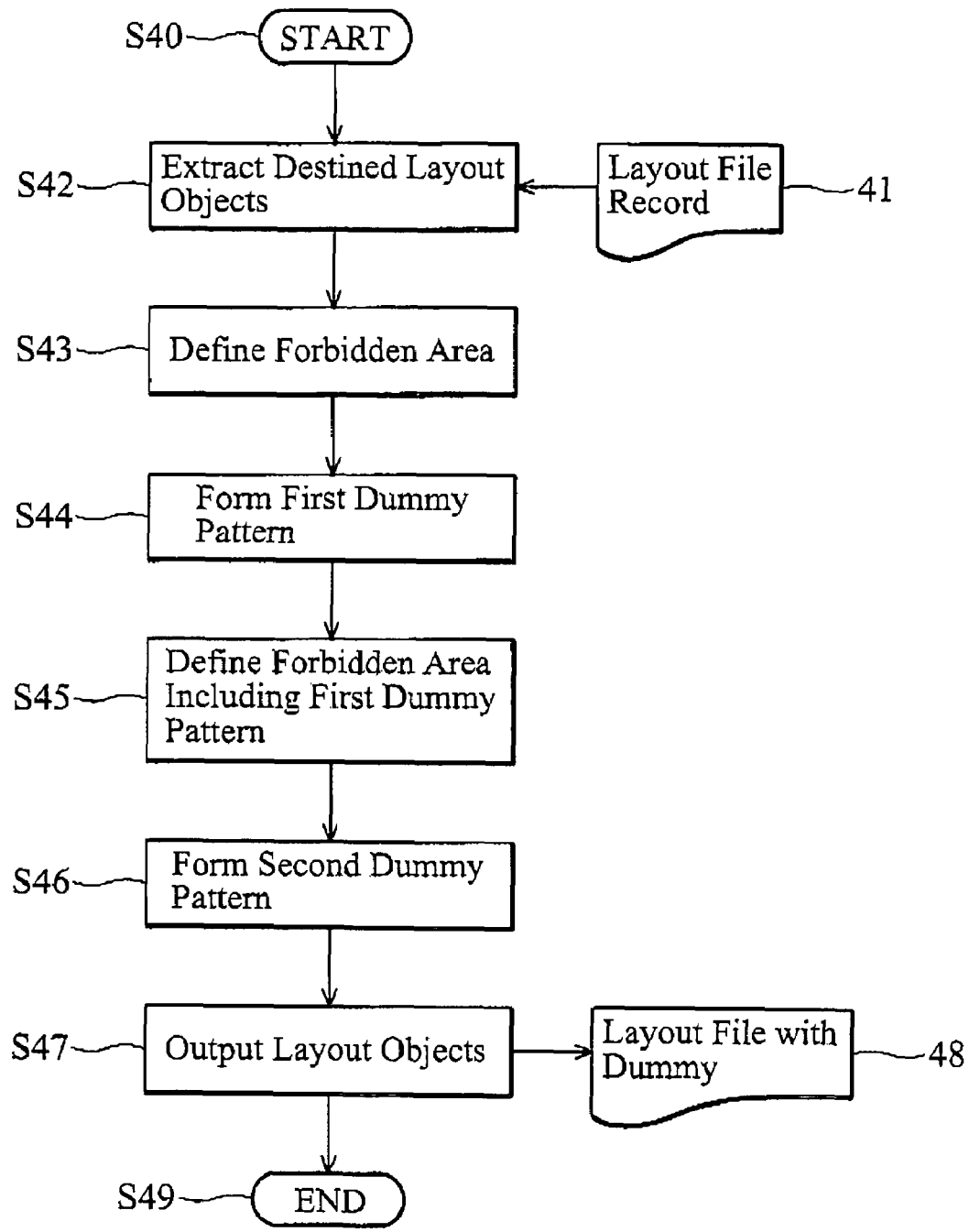
FIG. 4 is a flowchart of an embodiment of a layout method for STI.

FIG. 4 is a flowchart of an embodiment of a layout method for STI. A CAD routine is invoked (step S40) at which time a layout file record (block 41) is accessed (extracted) for processing by the disclosed supporting CAD routine.

Figure 5:
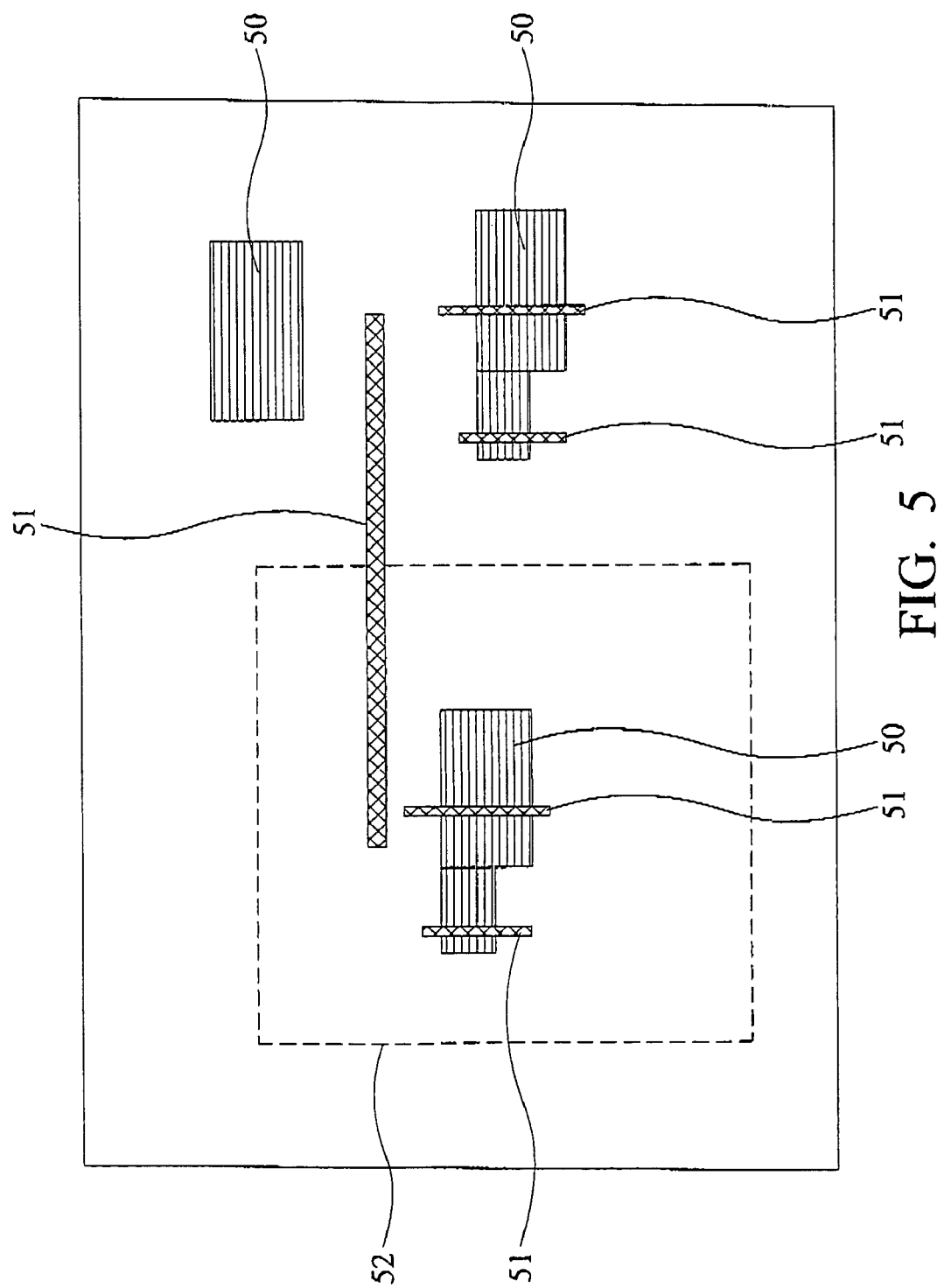
FIG. 5 shows layout without dummy filling.

For example, in step S42, destined layout objects can be accessed (extracted), comprising well 52, active area 50, and wiring patterns 51, as shown in FIG. 5. FIG. 5 is a top view corresponding to step S42 of FIG. 4. In FIG. 5, a partial device layout is shown, with no dummy fields yet provided.

Figure 6:
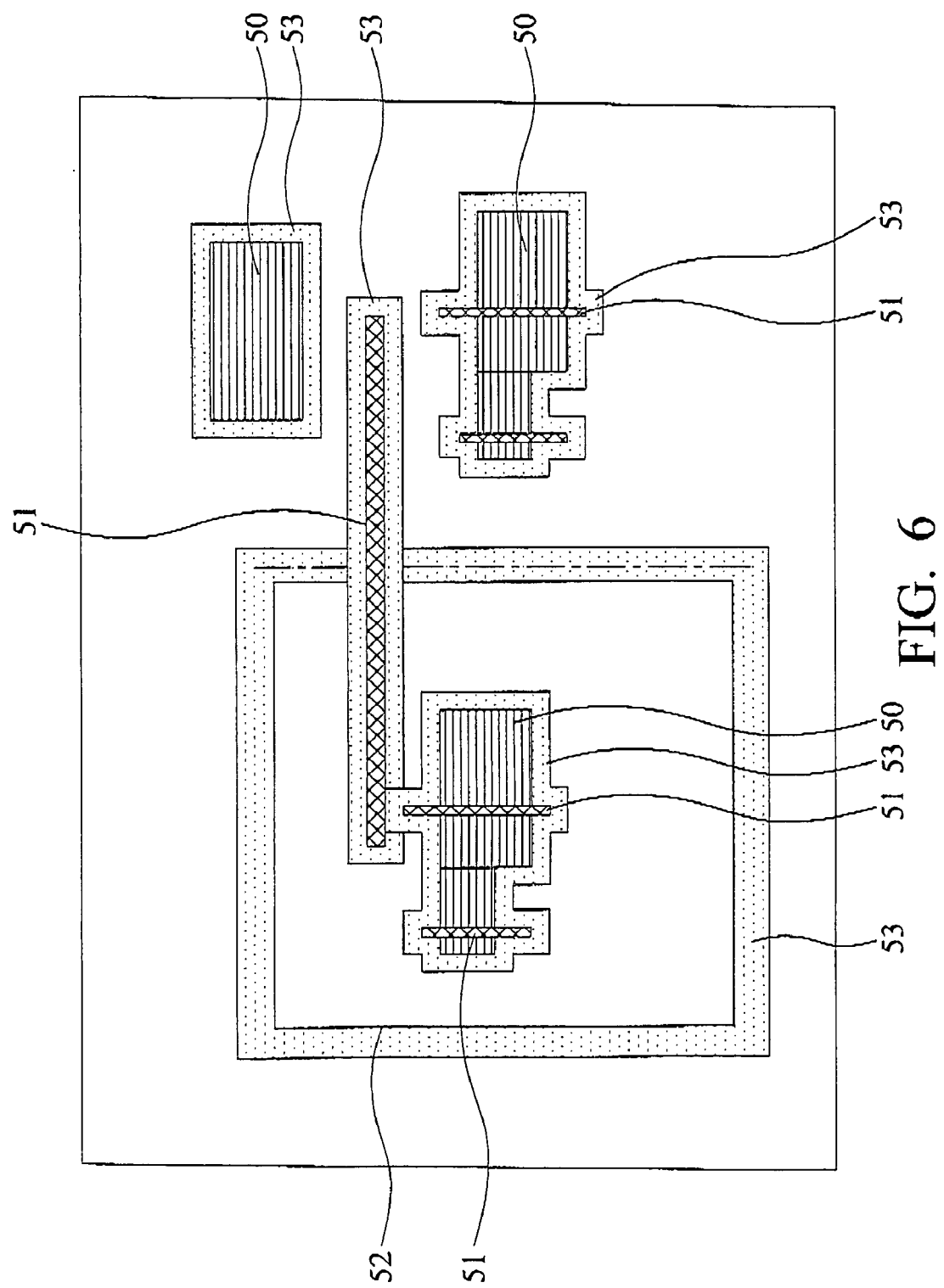
FIG. 6 shows layout after forbidden areas are defined.

In step S43, forbidden areas are defined based on the destined layout objects. Here, the forbidden areas surround the destined layout objects. FIG. 6 is a top view corresponding to step S43 of FIG. 4 and shows the same top view as presented in FIG. 5 with the addition of forbidden areas 53 definition thereof. The first forbidden areas 53 provide a border around well 52, active area 50, and wiring patterns 51. In the forbidden areas 53, formation of dummy patterns thereon would negatively affected circuit performance. For this reason, no dummy patterns are allowed over such surface areas. An attempt is made by the processing software to create polysilicon and active patterns of optimal density, without thereby negatively affecting circuit performance with the created dummy patterns. The definition of forbidden areas in effect "mask" logic operation language of a device layout since these forbidden areas directly relate to active device layout data.

Figure 7:
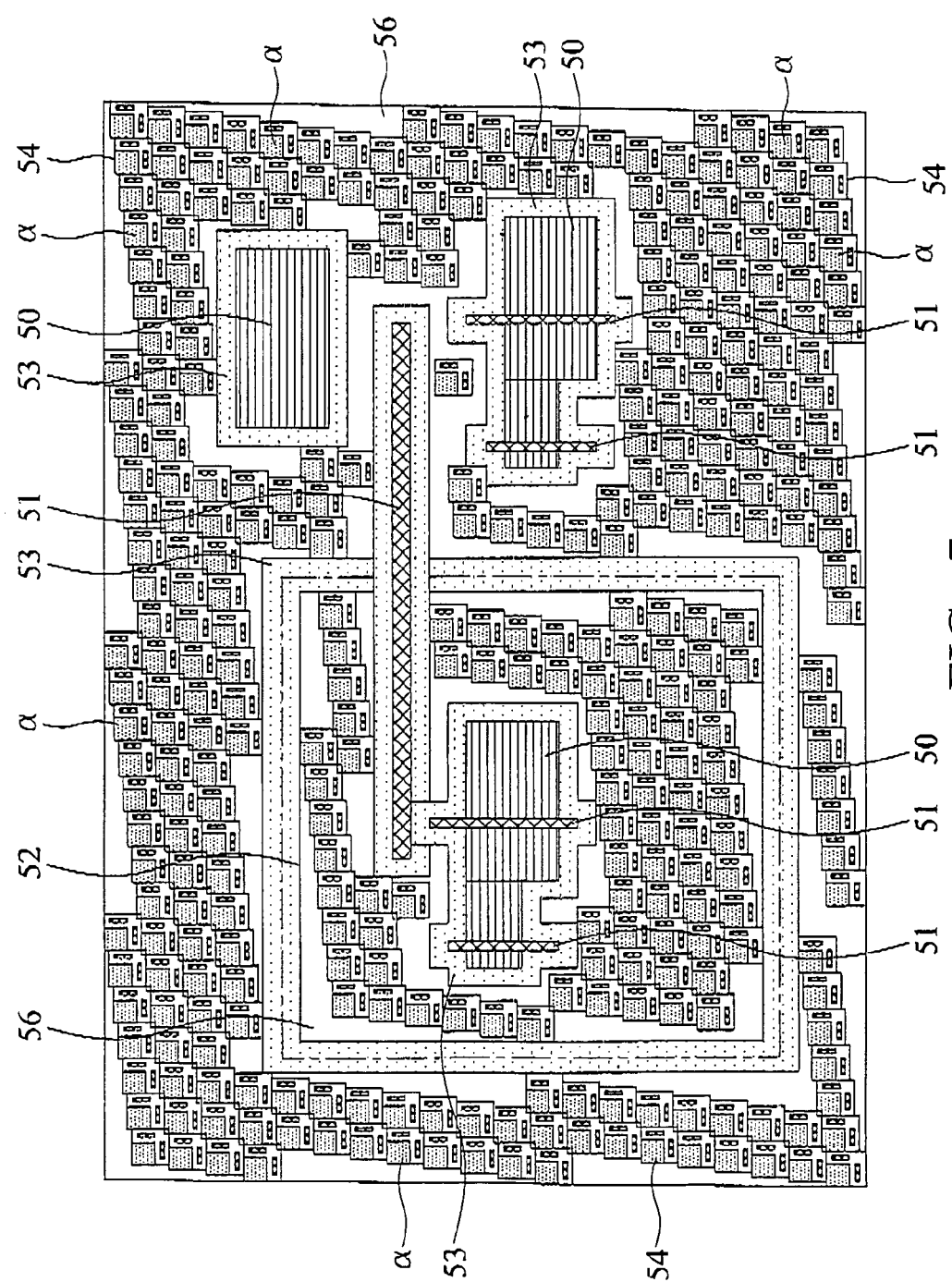
FIG. 7 shows layout after a first dummy pattern is formed.

In step S44, a first dummy pattern is formed in a first area, not comprising the destined layout objects and the forbidden areas 53. FIG. 7 is a top view corresponding to step S44 of FIG. 4 and shows a top view of a layout after the first dummy pattern 54 is formed in the first area 56 (the first dummy pattern instance formed). Here, the first area 56 is an area beyond the well 52, active area 50, and wiring patterns 51 (destined layout objects) and the forbidden areas 53. The first dummy pattern 54 may comprise a plurality of dummy cell patterns α, misaligned with each other to prevent orthogonal and regular pattern placement. Each may comprise a circumference 10', an active area pattern 12", and polysilicon patterns 14' and 14", as shown in FIG. 3. Note that not all first dummy pattern 54 and dummy cell patterns α have been highlighted in the top view shown in FIG. 7 in view of the large numbers thereof. All, however, can readily be recognized as having the same representation in the top view of FIG. 7.

This latter statement of "instance formed" needs to be further addressed. Conventionally, dummy cell patterns are created in layers such as in layers of polysilicon or active layers and the like. The embodiment creates dummy cell patterns and replicates these dummy cell patterns across a layout. This is referred to as "the use of dummy pattern". The conventional approach requires a relatively large volume of mapping data, by replicating dummy cell patterns as provided by the embodiment the data required to support of the created dummy cell patterns are significantly reduced in quantity.

Accordingly, each rectangle created over a surface requires 5 data points, such that, for 3 rectangles 15 data points are required per instance (for creation of a dummy cell pattern). If therefore, for example, 5K locations are addresses, all use the same 15 data points resulting in low data volume. Conventional applications, however, require 5K times 15 data points for a total of 75K data points, resulting in a large amount of data being required by this use of the dummy patterns.

Figure 8:
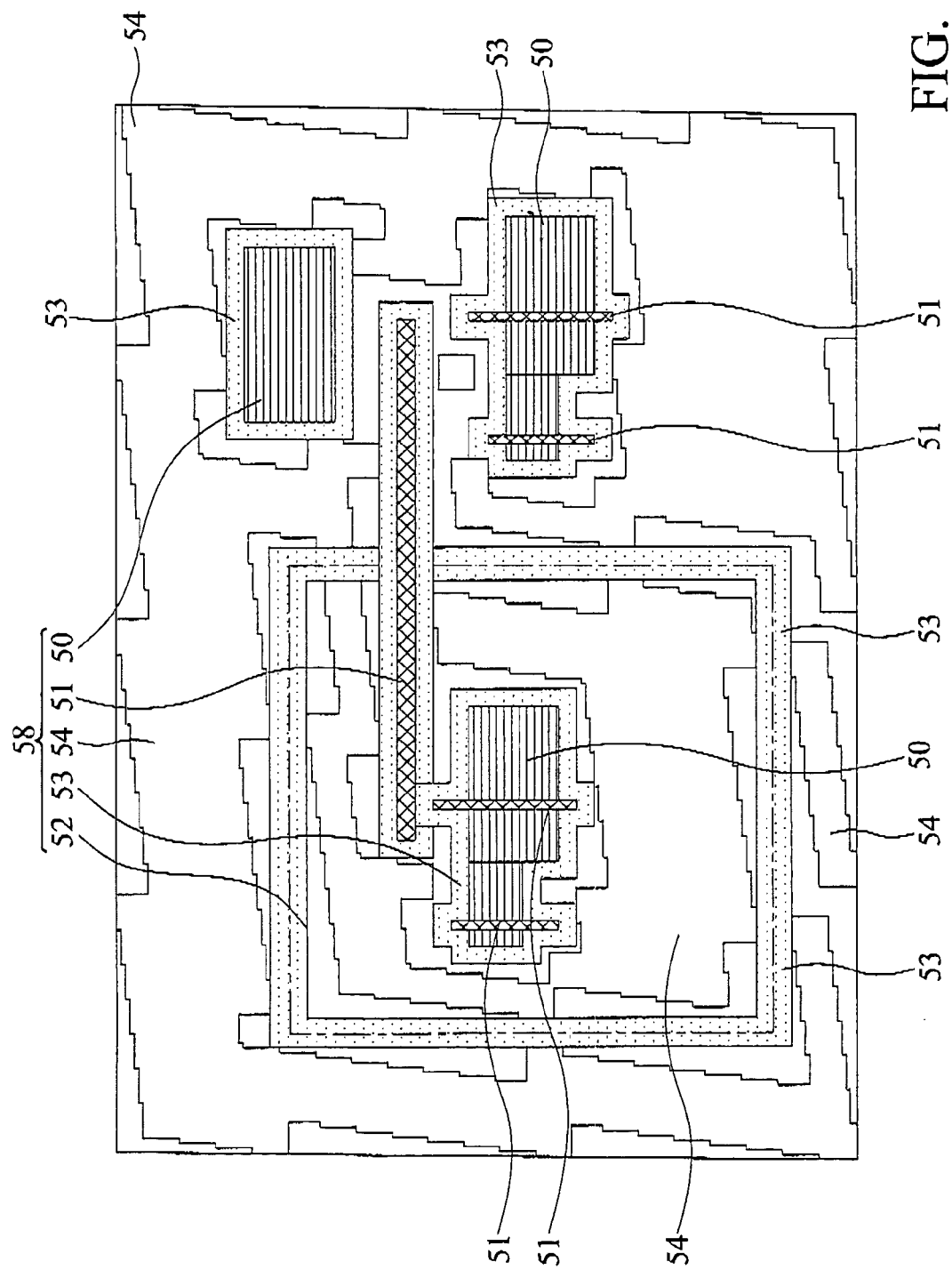
FIG. 8 shows layout after forbidden areas are defined again.

In step S45, another forbidden area 58 is defined, which may comprise the dummy pattern, the destined layout objects, and the previous forbidden area. FIG. 8 is a top view corresponding to step S45 of FIG. 4, showing a top view of layout after the forbidden area 58 comprising the destined layout objects 50, 51, and 52, and the forbidden area 53 is defined.

Figure 9:
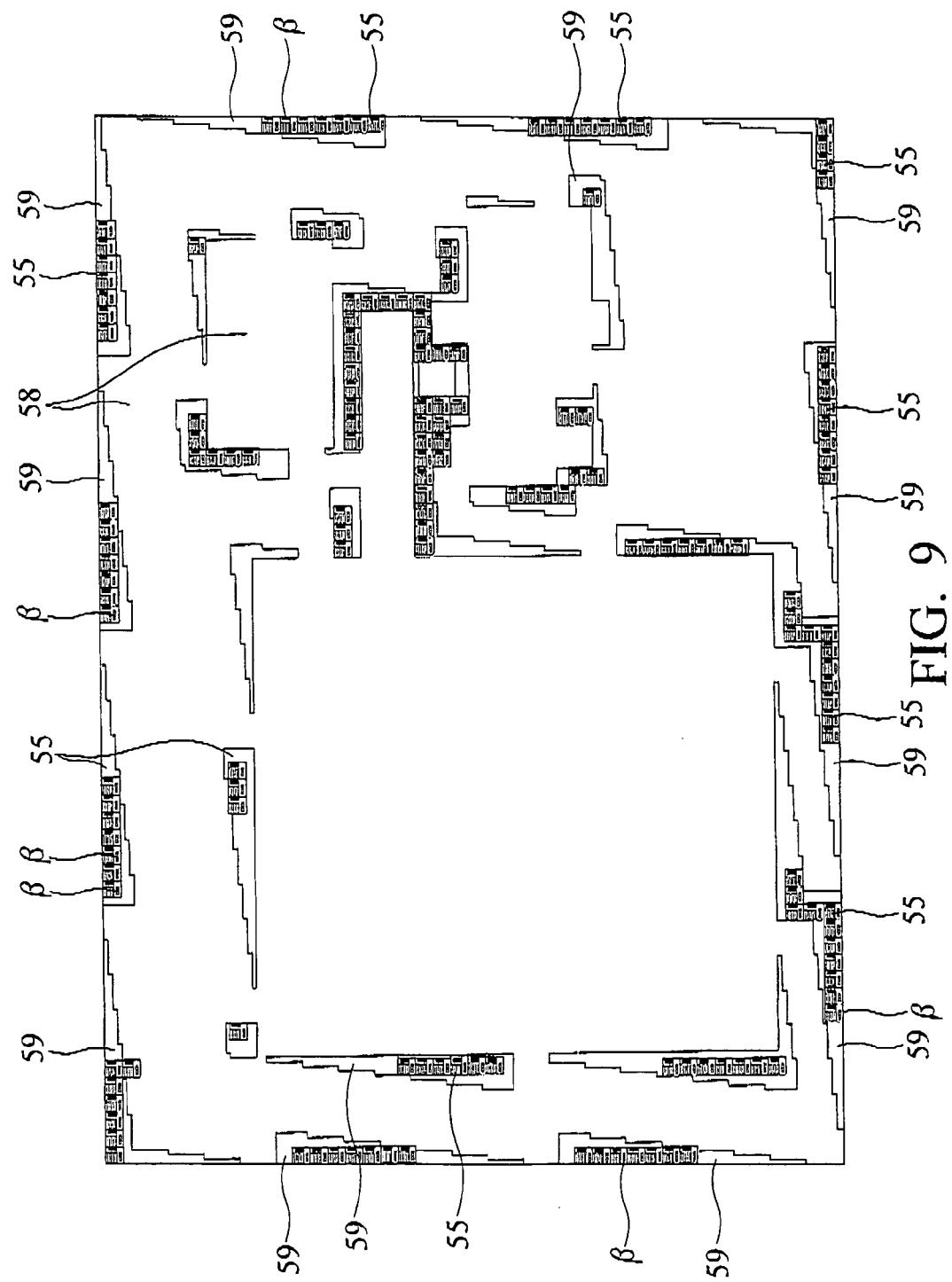
FIG. 9 shows layout after a second dummy pattern is formed.

In step S46, a second dummy pattern 55 is formed in a second area, not comprising the forbidden area 58 comprising the dummy pattern 54, the destined layout objects, and the previous forbidden area 53. FIG. 9 is a top view corresponding to step S46 of FIG. 4 and shows a top view of a layout after the second dummy pattern 55 is formed in the second area 59 (second dummy pattern instance formed). Here, the second area 59 is an area beyond the forbidden area 58 (shown in FIG. 8). The second dummy pattern 55 may comprise a plurality of dummy cell patterns β, misaligned with each other to prevent orthogonal and regular pattern placement. Each may further be similar to and smaller than the dummy cell pattern α. The provided second dummy pattern 55 provides a wide range of pattern filling. Note that not all second dummy pattern 55 and dummy cell patterns β have been highlighted in the top view shown in FIG. 9 in view of the large number of second dummy pattern 55 and dummy cell patterns β. All, however, can readily be recognized as having the same representation in the top view of FIG. 9.

Figure 10:
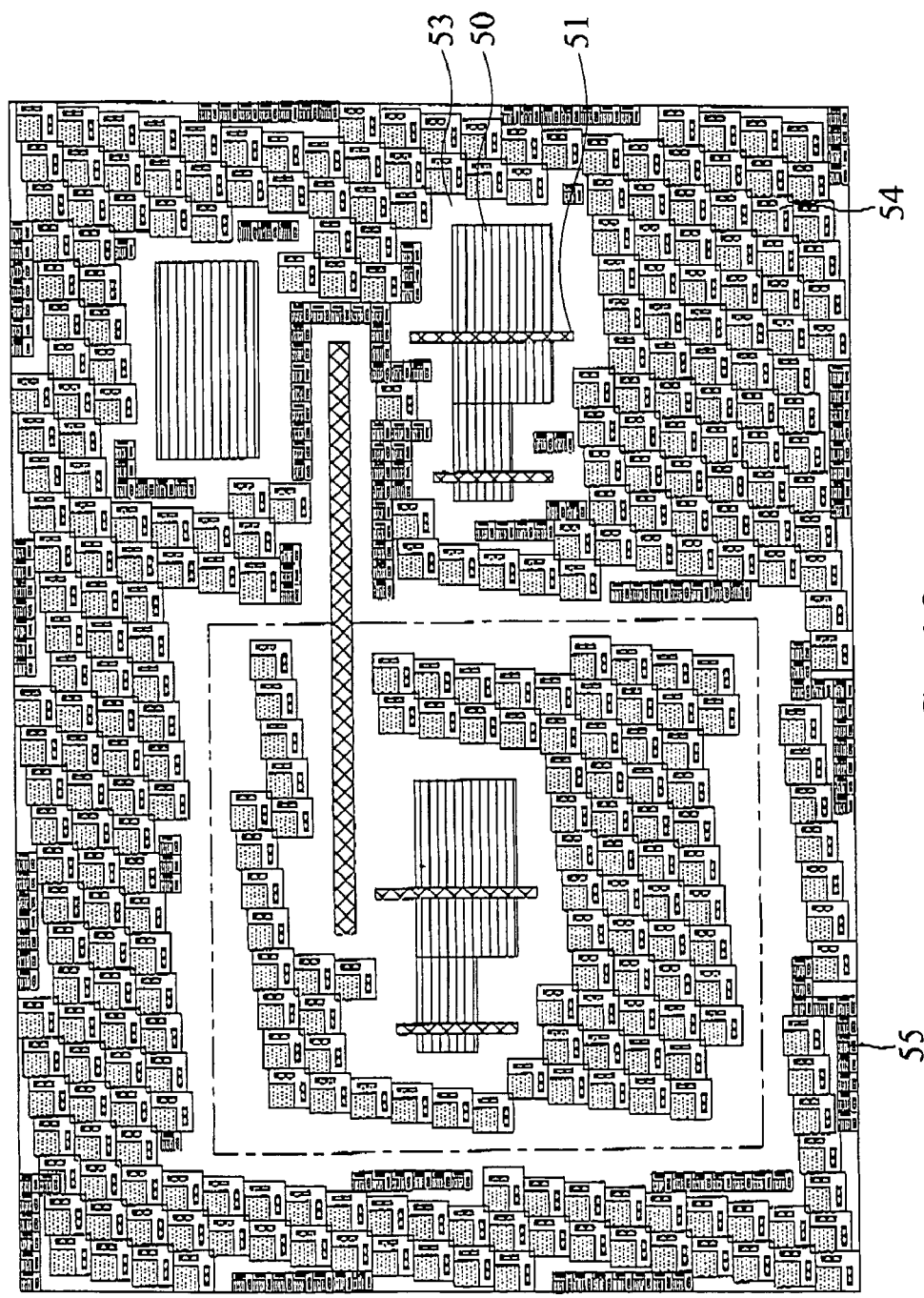
FIG. 10 shows a layout with the first and second dummy patterns.

In step S47, the first and second dummy patterns are attached to the destined layout objects, thereby creating second layout objects. FIG. 10 is a top view corresponding with step S47 of FIG. 4 and shows layout after the first and second dummy patterns 54 and 55 are formed. The various elements shown in FIG. 10 are known from previously highlighted elements of identical description, and only a sampling thereof is highlighted here. The combined areas of second dummy pattern 55 and forbidden area 58 are merged into layout objects, creating output (second) layout objects, stored under CAD control on the layout file with dummy (block 48). In step S49, the CAD run is then terminated.

As shown in the top view in FIG. 10, be realized that the embodiment provides a method of designing dummy patterns for planarization of STI to achieve global planarization, whereby the space or distance that is provided between an as-designed, layout objects 50/51 and the created dummy patterns, such as first dummy pattern 54 and the second dummy pattern 55, is kept to a minimum. This latter space or separation is typically between about 1 and 5 μm, such that forbidden area can therefore be defined as the area adjacent to and beyond layout objects, including previously defined dummy patterns, newly created dummy patterns are at least 1-5 μm removed from layout objects, thereby including previously defined dummy patterns.

Steps S45 and S46 may be omitted, such that, after the dummy pattern 54 is formed, the dummy pattern 55 is attached to the destined layout objects 50, 51, and 52, thereby creating second layout objects stored under CAD control on the layout file with dummy (block 48), as mentioned above.

Figure 11A:
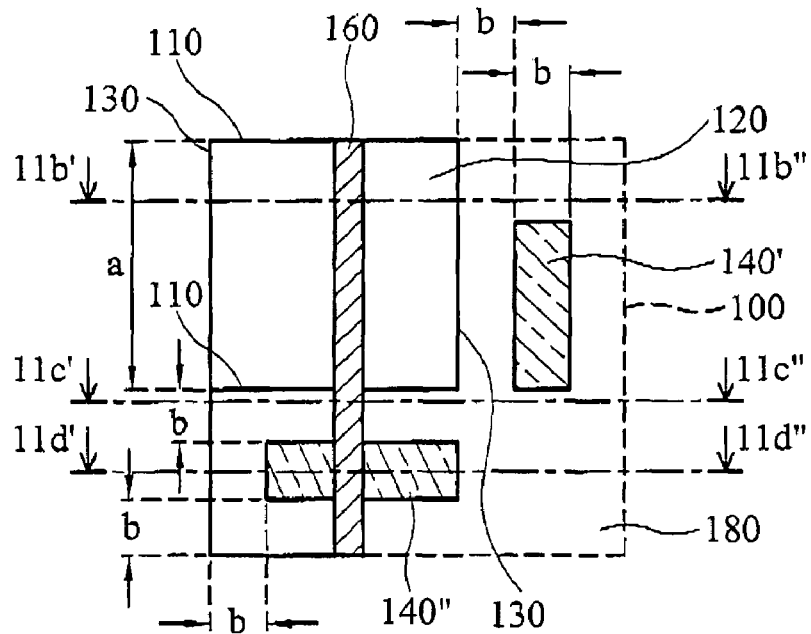
FIG. 11a shows a top view of an embodiment of a dummy device for STI, having the same top view as the dummy cell pattern shown in FIG. 3.
Figure 11B:
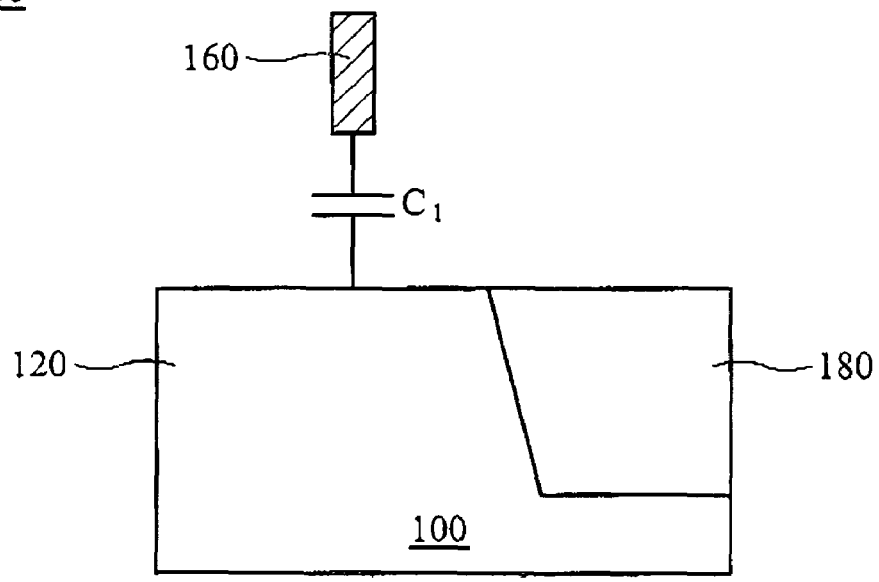
FIGS. 11b to 11c are cross-sections along the lines 11b'-11b", 11c'-11c", and 11d'-11d" in FIG. 11a, including parasitic capacitance calculations.
Figure 11C:
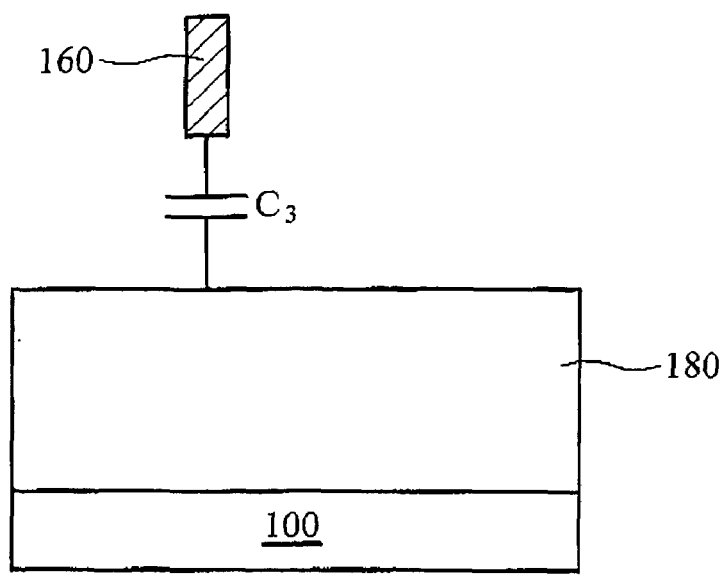
Figure 11D:
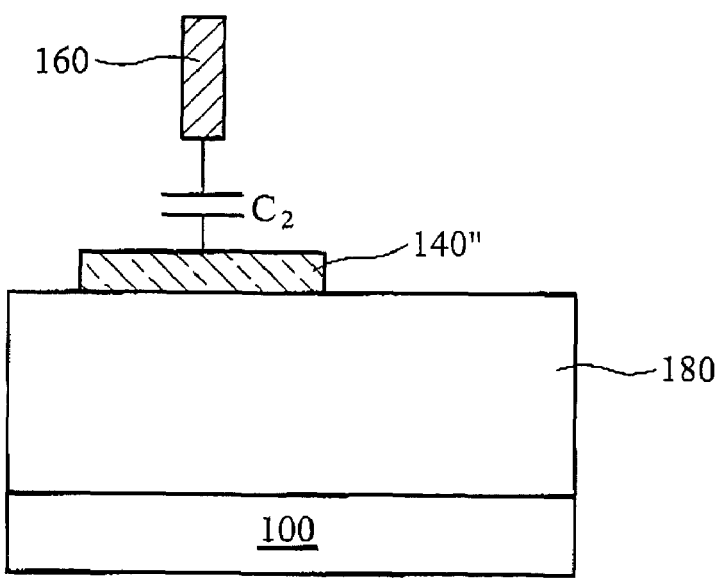

FIG. 11a shows a top view of an embodiment of a dummy device for STI, having the same top view as the dummy cell pattern shown in FIG. 3. FIGS. 11b to 11d are cross-sections along the lines 11b'-11b", 11c'-11c", and 11d'-11d" shown in FIG. 11a, including parasitic capacitance calculations. In FIG. 11a, the dummy device 200 comprises a substrate 100 comprising a shallow trench isolation area 180, a dummy active layer 120, and dummy polysilicon layers 140' and 140". The dummy active layer 120 is within the shallow trench isolation (STI) area 180. Moreover, the top surface of the dummy active layer 120 is substantially level with that of the STI area 180. The dummy polysilicon layers 140' and 140" are formed only on the STI area 180, outside the underlying dummy active layer 120. Moreover, the dummy active layer 120 may be rectangular with two pairs of sides 110 and 130. In this case, the dummy polysilicon layer 140' is rectangular and parallel to the pair of sides 130 and the dummy polysilicon layer 140" is rectangular and parallel to the pair of sides 110. Each of the dummy polysilicon layers 140' and 140" may have a length between about 4.5 μm and 2.0 μm and a width between about 1.4 μm and 0.5 μm. Additionally highlighted in FIG. 11a are dimensions "a" and "b", subsequently used for calculations of parasitic capacitance between the first level of metal interconnect 160 and the dummy device 200. For example, "a" can be between about 2.0 μm and 4.5 μm and "b" between about 0.8 μm and 0.30 μm.

FIGS. 11b through 11d compare each of these figures with the cross section highlighted in FIG. 11a. Cross section 11d'-11d", highlighted in FIG. 11a, refers to FIG. 11d. Cross section of FIG. 11d, referring to FIG. 11a, is recognized as through the STI area 180, over which the dummy polysilicon layer 140" is formed, and above which the first level of metal interconnect 160 is formed.

Parasitic capacitances can be defined in the various dummy layers. $C_1$ is the parasitic capacitance between the first level of metal interconnect 160 and the dummy active area layer 120 ($C_1 = C_{M1-AA}$), as shown in FIG. 11b. $C_2$ is the parasitic capacitance between the first level of metal interconnect 160 and the dummy polysilicon layer 140" and the underlying STI area 180 ($C_2 = C_{M1-PO(STI)}$) as shown in FIG. 11d. $C_3$ is the parasitic capacitance between the first level of metal interconnect 160 and the STI area 180 ($C_3 = C_{M1-STI}$), as shown in FIG. 11c. The dummy device 200 shown in FIGS. 11a-11d is referred to as case A with total parasitic capacitances of:

$$C_A = (a \times C_1) + ((1-a-2b) \times C_2) + (2b \times C_3)$$

Figure 12A:
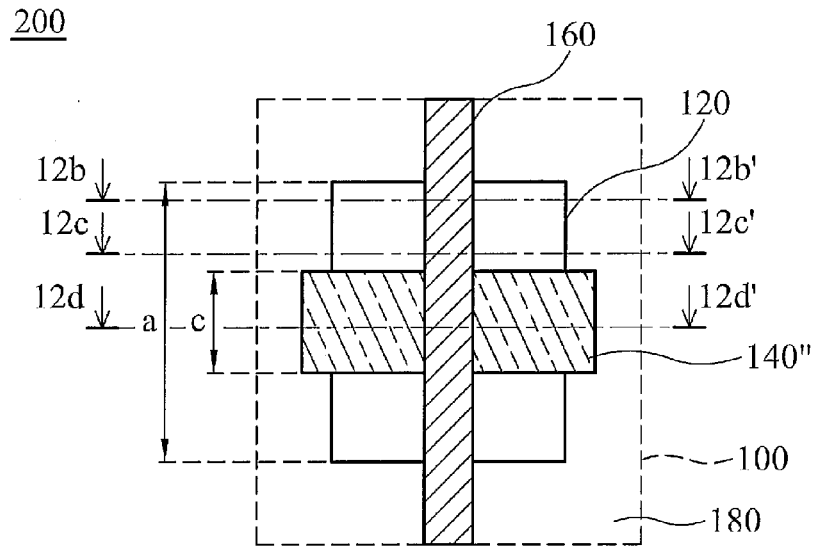
FIG. 12a shows a top view of a conventional dummy device, having the same top view as the dummy cell pattern shown in FIG. 1.
Figure 12B:
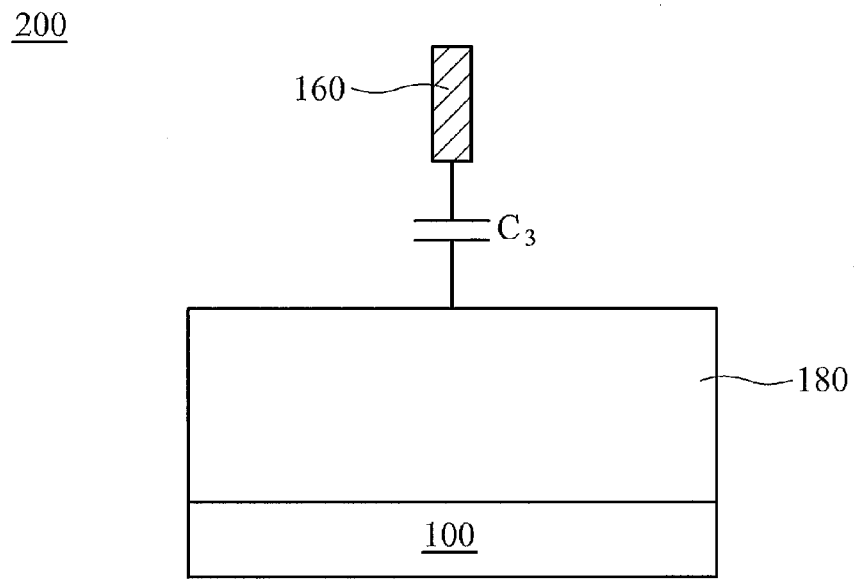
FIGS. 12b to 12d are cross-sections along the lines 12b'-11b", 12c'-12c", and 12d'-12d" in FIG. 12a, including parasitic capacitance calculations.
Figure 12C:
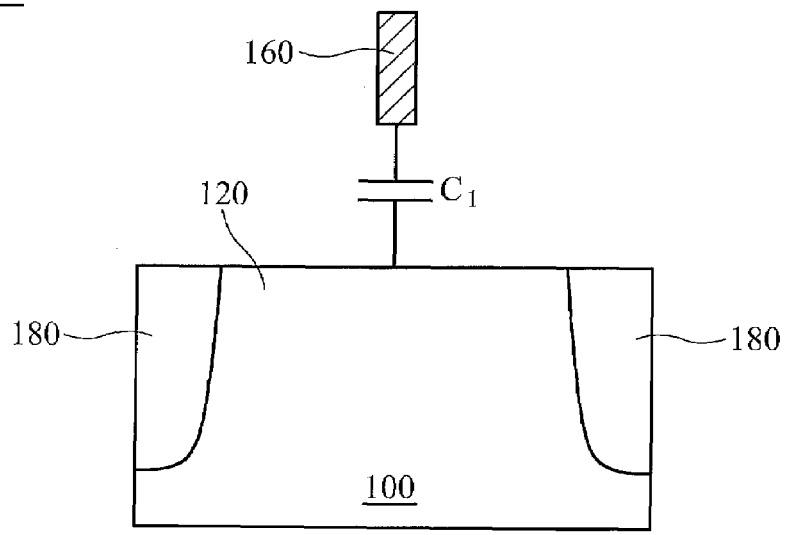
Figure 12D:
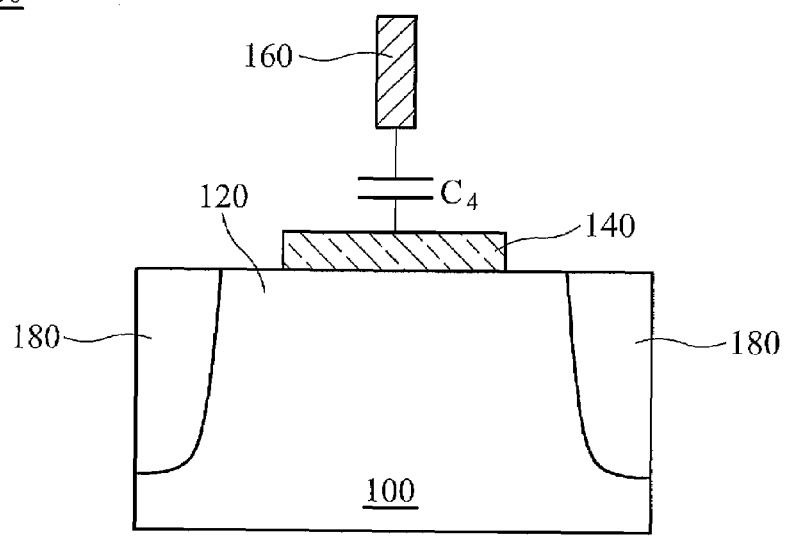

FIG. 12a is a top view of a conventional dummy device, having the same top view as the dummy cell pattern shown in FIG. 1. FIGS. 12b to 12d are cross-sections along lines 12b'-12b", 12c'-12c", and 12d'-12d" shown in FIG. 12a, including parasitic capacitance calculations. The same reference numbers as FIG. 11a are used in the drawings. In FIG. 12a, the dummy device 200 comprises a substrate 100 having a shallow trench isolation area 180, a dummy active layer 120, and a dummy polysilicon layer 140. The dummy polysilicon layer 140 is formed on the dummy active layer 120 within the STI area 180. Additionally highlighted in FIG. 12a are dimensions "a" and "c", used for subsequent calculations of parasitic capacitance between the first level of metal interconnect 160 and the dummy device 200.

FIGS. 12b through 12d compare each of these figures with the cross section as highlighted in FIG. 11a. For example, the crosscut 12d'-12d", highlighted in FIG. 12a, refers to FIG. 12d. The cross section of FIG. 12d, referring to FIG. 12a, is recognized as through the dummy active layer 120, over which the dummy polysilicon layer 140 is formed, above which the first level of metal interconnect 160 is formed.

The parasitic capacitances can be defined in the various dummy layers. $C_1$ is the parasitic capacitance between the first level of metal interconnect 160 and the dummy active area layer 120 ($C_1 = C_{M1-AA}$), as shown in FIG. 12c. $C_3$ is the parasitic capacitance between the first level of metal interconnect 160 and the STI area 180 ($C_3 = C_{M1-STI}$), as shown in FIG. 12b. $C_4$ is the parasitic capacitance between the first level of metal interconnect 160 and the dummy polysilicon layer 140 and the underlying dummy active area layer 120 ($C_4 = C_{M1-PO(AA)}$), as shown in FIG. 12d. The dummy device 200 shown in FIGS. 12a-12d is referred to case B with total parasitic capacitances of:

$$C_B = ((a-c) \times C_1) + ((1-a) \times C_3) + (c \times C_4)$$

Figure 13A:
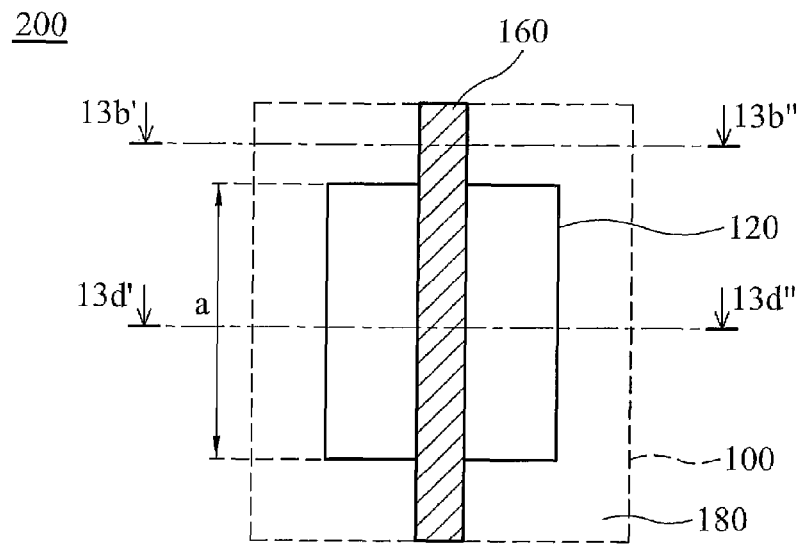
FIG. 13a shows a top view of another conventional dummy device, having the same top view as the dummy cell pattern shown in FIG. 2.
Figure 13B:
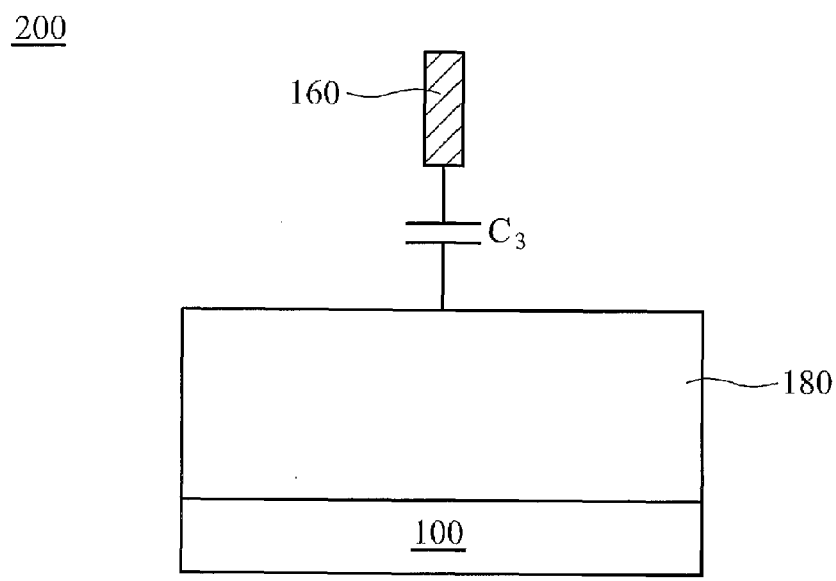
FIGS. 13b to 13c are cross-sections along the lines 13b'-13b" and 13c'-13c" in FIG. 13a, including parasitic capacitance calculations.
Figure 13C:
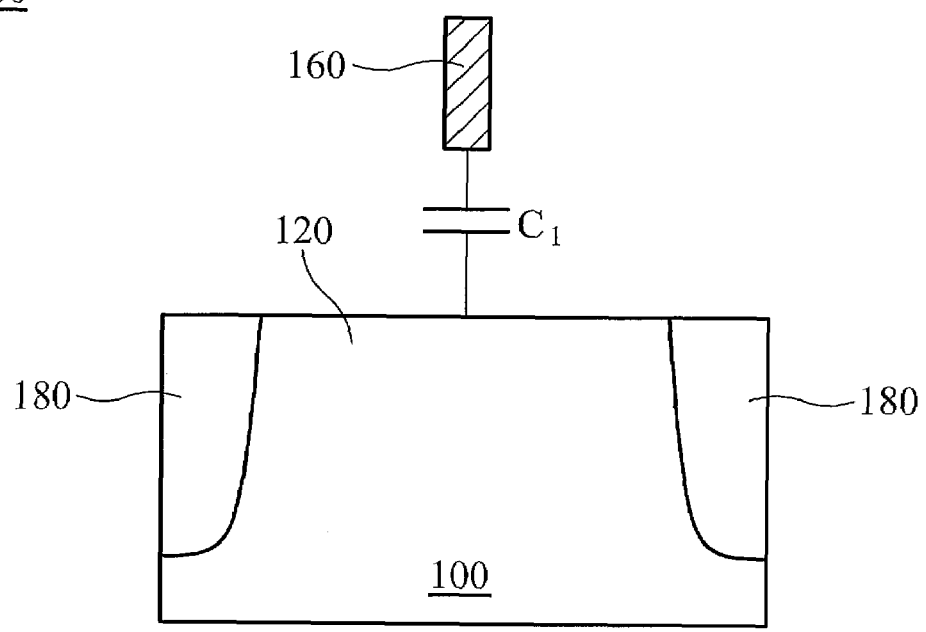

FIG. 13a is a top view of another conventional dummy device, having the same top view as the dummy cell pattern shown in FIG. 2. FIGS. 13b to 13c are cross-sections along the lines 13b'-13b" and 13c'-13c" shown in FIG. 13a, including parasitic capacitance calculations. The same reference numbers as FIG. 11a are used in the drawings. In FIG. 13a, the dummy device 200 comprises a substrate 100 having a shallow trench isolation area 180 and a dummy active layer 120. Additionally highlighted in FIG. 13a is the dimension "a", used for subsequent calculations of parasitic capacitance between the first level of metal interconnect 160 and the dummy device 200.

FIGS. 13b through 13c compare each of these figures with the cross section as highlighted in FIG. 13a. Cross section 13c'-13c", highlighted in FIG. 13a, refers to FIG. 13c. Cross section of FIG. 13c, referring to FIG. 13a, is recognized as through the dummy active layer 120, over which the first level of metal interconnect 160 is formed.

$C_1$ is the parasitic capacitance between the first level of metal interconnect 160 and the dummy active area layer 120 ($C_1 = C_{M1-AA}$), as shown in FIG. 13c. $C_3$ is the parasitic capacitance between the first level of metal interconnect 160 and the STI area 180 ($C_3 = C_{M1-STI}$), as shown in FIG. 13b. The dummy device 200 shown in FIGS. 13a-13c is referred to case C with the total parasitic capacitances of:

$$C_c = (a \times C_1) + ((1-a) \times C_3)$$

To summarize:

case A, as discussed above, comprises dummy layers of the embodiment, the dummy polysilicon layer is formed in the STI area.

case B uses both active and polysilicon dummy layers.

case C contains only active dummy layer.

It has been determined that case C has the lowest parasitic capacitance of the three cases, case A has a parasitic capacitance about 5-15% less than the parasitic capacitance of case B. Case C, however, cannot avoid dishing in the STI area since no dummy polysilicon layer is formed thereon. Case B, however, exhibits higher parasitic capacitance than case A or C. Therefore, according to the embodiments of the invention, lower parasitic capacitance can be obtained and global planarization can be achieved.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A dummy cell pattern for shallow trench isolation, comprising:
   a dummy active area and a shallow trench isolation area bounded by a circumference;
   an active area pattern completely overlapping the dummy active area, wherein the dummy active area is completely covered by the active area pattern; and
   a first polysilicon pattern in the shallow trench isolation area, outside the active area pattern.

2. The dummy cell pattern as claimed in claim 1, wherein the circumference is rectangular with a first pair and a second pair of sides and the dummy active area is rectangular with a third pair and a fourth pair of sides corresponding to the first pair and the second pair of sides, respectively.

3. The dummy cell pattern as claimed in claim 2, wherein the first polysilicon pattern is between one of the first pair of sides and one of the corresponding third pair of sides.

4. The dummy cell pattern as claimed in claim 2, further comprising a second polysilicon pattern in the shallow trench isolation area, outside the active area pattern and between one of the second pair of sides and one of the corresponding fourth pair of sides.

5. The dummy cell pattern as claimed in claim 4, wherein another of the first pair of sides coincides with another of the corresponding third pair of sides and another of the second pair of sides coincides with another of the corresponding fourth pair of sides.

6. The dummy cell pattern as claimed in claim 4, wherein the second polysilicon pattern is rectangular.

7. The dummy cell pattern as claimed in claim 1, wherein the first polysilicon pattern is rectangular.

8. The dummy cell pattern as claimed in claim 1, wherein the first polysilicon pattern does not overlap any active area.

* * * * *